(12) United States Patent
Schmidhammer (10) Patent No.: US 7,719,388 B2
(45) Date of Patent: May 18, 2010

(54) RESONATOR OPERATING WITH BULK ACOUSTIC WAVES

(75) Inventor: Edgar Schmidhammer, Stein (DE)

(73) Assignee: EPCOS AG, Munich (DE)

( * ) Notice: Subject to any disclaimer, the term of this patent is extended or adjusted under 35 U.S.C. 154(b) by 260 days.

(21) Appl. No.: 11/658,117

(22) PCT Filed: Jun. 3, 2005

(86) PCT No.: PCT/EP2005/005999

§ 371 (c)(1),
(2), (4) Date: Mar. 2, 2007

(87) PCT Pub. No.: WO2006/010399

PCT Pub. Date: Feb. 2, 2006

(65) Prior Publication Data

US 2008/0258845 A1 Oct. 23, 2008

(30) Foreign Application Priority Data

Jul. 23, 2004 (DE) .................. 10 2004 035 812

(51) Int. Cl.
*H03H 9/17* (2006.01)
*H01L 41/083* (2006.01)

(52) U.S. Cl. ...................... 333/187; 333/191

(58) Field of Classification Search ................ 333/186, 333/187, 188, 189, 190, 191, 192; 310/324
See application file for complete search history.

(56) References Cited

U.S. PATENT DOCUMENTS

| | | | |
|---|---|---|---|
| 5,821,833 A | 10/1998 | Lakin | |
| 5,864,261 A | 1/1999 | Weber | |
| 6,262,637 B1 * | 7/2001 | Bradley et al. | ............... 333/133 |
| 6,437,484 B1 * | 8/2002 | Nishimura et al. | ........... 310/324 |
| 6,720,844 B1 | 4/2004 | Lakin | |
| 6,927,649 B2 | 8/2005 | Metzger et al. | |
| 6,992,400 B2 | 1/2006 | Tikka et al. | |
| 7,102,460 B2 | 9/2006 | Schmidhammer et al. | |
| 7,187,109 B2 | 3/2007 | Tikka et al. | |
| 7,259,498 B2 * | 8/2007 | Nakatsuka et al. | ........... 310/324 |
| 7,332,985 B2 * | 2/2008 | Larson et al. | ............... 333/187 |
| 7,349,717 B2 | 3/2008 | Block et al. | |
| 7,489,067 B2 | 2/2009 | Metzger et al. | |
| 2003/0227357 A1 | 12/2003 | Metzger et al. | |
| 2004/0257172 A1 | 12/2004 | Schmidhammer | |
| 2005/0082951 A1 | 4/2005 | Tikka et al. | |

(Continued)

FOREIGN PATENT DOCUMENTS

WO  WO03/017480  2/2003

OTHER PUBLICATIONS

Written Opinion for PCT/EP2005/005999.

(Continued)

*Primary Examiner*—Dean O Takaoka
(74) *Attorney, Agent, or Firm*—Fish & Richardson P.C.

(57) ABSTRACT

Disclosed is a resonator that is mounted on a substrate, operates with acoustic bulk waves, and is disposed above an acoustic mirror. According to the invention, the basic mode of the acoustic bulk wave that can be generated in the resonator is suppressed while a higher mode can be excited in parallel and be utilized for the resonator by adjusting the acoustic mirror.

20 Claims, 9 Drawing Sheets

U.S. PATENT DOCUMENTS

| | | |
|---|---|---|
| 2005/0167854 A1 | 8/2005 | Tikka et al. |
| 2006/0091975 A1 | 5/2006 | Schmidhammer |
| 2006/0164183 A1 | 7/2006 | Tikka et al. |
| 2006/0194550 A1 | 8/2006 | Block et al. |
| 2007/0103037 A1 | 5/2007 | Metzger et al. |
| 2007/0296513 A1 | 12/2007 | Ruile et al. |
| 2007/0296521 A1 | 12/2007 | Schmidhammer |
| 2008/0068109 A1 | 3/2008 | Schmidhammer |
| 2008/0084136 A1 | 4/2008 | Schmidhammer |
| 2008/0094154 A1 | 4/2008 | Heinze et al. |
| 2008/0136555 A1 | 6/2008 | Schmidhammer |
| 2008/0246556 A1 | 10/2008 | Heinze et al. |
| 2008/0258845 A1 | 10/2008 | Schmidhammer |
| 2008/0272853 A1 | 11/2008 | Heinze et al. |
| 2009/0002098 A1* | 1/2009 | Mayer et al. ............. 333/189 |
| 2009/0009262 A1 | 1/2009 | Schmidhammer et al. |
| 2009/0079521 A1 | 3/2009 | Heinze et al. |
| 2009/0093270 A1 | 4/2009 | Block et al. |

OTHER PUBLICATIONS

International Search Report for PCT/EP2005/005999.

D. Cushman et al "SBAR Filter Monolithically Integrated with HBT Amplifier" IEEE Ultrasonics Symposium, 1990, pp. 519-524.

D. E. Oates et al "Microwave Bulk-Acoustic-Wave Reflection-Grating Resonators" Ultrasonics, Ferroelectrics and Frequency Control, vol. 35, No. 3, May 1988, pp. 315-322.

E. Benes et al "Comparison Between BAW and SAW Sensor Principles" IEEE International Frequency Control Symposium, 1997, pp. 5-20.

G. D. Mansfield et al "Acoustic HBAR Spectroscopy of Metal (W, Ti, Mo, Al) Thin Films" IEEE Ultrasonics Symposium, 2001, pp. 415-418.

G. D. Mansfield et al "Bulk Acoustic Wave Microwave Composite Resonators and Filters with Acoustic Isolation of Resonating Layers" IEEE Ultrasonics Symposium, 1998, pp. 963-966.

G. D. Mansfield et al "Modern State and Perspectives of Bulk Acoustic Wave Composite Resonators" IEEE Ultrasonics Symposium, 1999, pp. 843-846.

G. R. Kline et al "Overmoded High Q Resonators for Microwave Oscillators" IEEE International Frequency Control Symposium, 1993, pp. 718-721.

M. A. Dubois et al "BAW Resonators based on Aluminum Nitride Thin Films" IEEE Ultrasonics Symposium, 1999, pp. 907-910.

M. M. Driscoll et al "Extremely Low Phase Noise UHF Oscillators Utilizing High Overtone, Bulk-Acoustic Resonators" IEEE Ultrasonics Symposium, 1990, pp. 513-518.

M. M. Driscoll et al "Extremely Low Phase Noise UHF Oscillators Utilizing High Overtone, Bulk-Acoustic Resonators" IEEE Transactions on Ultrasonics, Ferroelectrics and Frequency Control vol. 39. No. 6, Nov. 1992, pp. 774-779.

Nakamura et al "Evaluation of Acoustic Properties of Thin Films Using Piezoelectric Overtone Thickness-Mode Resonators" IEEE Ultrasonics Symposium, 2000.

P. Osbond et al "The Influence of ZnO and Electrode Thickness on the Performance of Thin Film Bulk Acoustic Wave Resonators" IEEE Ultrasonics Symposium, 1999, pp. 911-914.

R. Lanz et al "Solidly Mounted BAW Filters for the 6 to 8 GHz Range Based on ALN Thin Films" IEEE Ultrasonics Symposium, 2001, pp. 843-846.

R. A. Moore et al. "High Overtone Bulk Resonator Stabilized Microwave Sources" IEEE Ultrasonics Symposium, 1981, pp. 414-424.

R. B. Strokes et al. "Monolithic Bulk Acoustic Filters to X-Band in GaAs" IEEE Ultrasonics Symposium, 1993, pp. 547-551.

S. G. Burns et al "High Frequency Oscillators Using Cointergrated BAW Thin-Film Piezoelectrics with Microwave BJTs" IEEE Ultrasonics Symposium, 1991, 45th Annual symposium on Frequency Control, pp. 207-211.

S. P. Caldwell et al "High-Overtone, Bulk Acoustic Resonator Frequency Stability Improvements" IEEE International Frequency Control Symposium, 1993.

English translation of Written Opinion for PCT/EP2005/005999.

Andrew Brown et al "Microwave and Millimeter-wave High-Q Micromachined Resonators" International Journal of RF and Microwave Computer-Aided Engineering, pp. 1-8 (1999).

\* cited by examiner

RESONATOR OPERATING WITH BULK ACOUSTIC WAVES

TECHNICAL FIELD

This patent application describes a resonator operating with bulk acoustic waves (or FBAR, Thin Film Bulk Acoustic Wave Resonator), which is also called a BAW resonator (Bulk Acoustic Wave Resonator).

BACKGROUND

A BAW resonator features a piezoelectric layer, which is arranged between two metal layers (electrodes). Instead of only one piezoelectric layer, a layer sequence can also be used. The layers are deposited on a substrate one after the other and structured to form resonators, which are connected to each other electrically and which together can implement, e.g., a filter circuit. The resonator surface defined by the electrodes or their overlapping area is also called an active region. The thickness of the piezoelectric layer of a BAW resonator, whose resonance frequency be in the frequency range between 0.1-10 GHz, equals at most approximately 0.1-10 μm.

When an electric field is applied to the electrodes of the BAW resonator perpendicular to the layer arrangement, mechanical stress (expansion or compression of the material) is released in the piezoelectric layer of the BAW resonator through the deflection of atoms in the field direction. The deflection of the atoms is mainly in the perpendicular direction (for a c-axis perpendicular to the piezoelectric layer).

A BAW resonator can be provided with an acoustic reflector, which is arranged between a carrier substrate and the BAW resonator. The acoustic reflector is composed of alternating layers of a high and low acoustic impedance, whose layer thicknesses equal approximately one-quarter wavelength of the acoustic fundamental mode (relative to the propagation velocity of the acoustic wave in the appropriate material). The acoustic reflector therefore provides one or more boundary surfaces, which reflect the acoustic wave back into the resonator at the resonance frequency and prevent the emission of the wave in the direction of the carrier substrate.

The thickness of the piezoelectric layer defines the limit frequency of the BAW resonator. The limit frequency is the resonance frequency of the fundamental mode, which is the first harmonic of the vertical longitudinal bulk acoustic wave. The propagation time of the fundamental mode (first harmonic of the vertical longitudinal wave) in the piezoelectric layer of thickness d equals 2 d/$v_L$ ($v_L$=propagation velocity of the longitudinal acoustic wave). The frequency of the fundamental mode is then $f_{L1} \approx v_L/2$ d.

FBAR resonators can be used for producing passband high-frequency filters and can be used, e.g., in mobile communications terminals. These resonators are also used in frequency-defining elements in oscillators and for sensors.

FBAR filters are being used increasingly in applications in which the use of surface acoustic wave filers (SAW filters) is not possible due to the technical limitations of fabrication. While for SAW filters, the filter structure must be generated by a two-dimensional lithographic structure, for FBAR filters, just the layer thickness of the layers that are used determine the frequency. These can be controlled with considerably more precision and ease than a 2-D structure. While for SAW filters, a technologically feasible upper limit is currently at ca. 5 GHz, for FBAR technology, currently an upper limit at ca. 10 GHz is seen. There exist, however, filter applications between 10 and 12 GHz, for example, for satellite receivers. This frequency range is currently covered by filters based on DRO technology, which uses dielectric resonators. A disadvantage of this technique is that it generates high costs.

FBAR filters and resonators for the range above 10 GHz have already become known, but these are not suitable for mass production due to the expensive technology and are still found in the laboratory sector.

SUMMARY

Described herein is a resonator which operates with bulk acoustic waves, which is economical to produce, and which can also be used for high frequencies over 10 GHz.

The basic idea is to suppress the fundamental mode of an FBAR resonator and, e.g., to excite a higher mode and to use this for the resonator.

Higher oscillation modes in FBAR resonators are definitely known, but until now were viewed only as interference. Therefore, in general, there has been the goal of suppressing interfering higher modes as much as possible in order to keep all of the acoustic energy of the resonator in the fundamental mode. In contrast, this patent application describes a resonator that suppresses the fundamental mode of the bulk acoustic wave that can be generated in the resonator. Thus, a resonator is obtained that has a resonance frequency at a multiple of the resonance frequency of the fundamental mode, for a given thickness of the piezoelectric layer, which is decisive for determining the resonance frequency in the fundamental mode. Here, the frequency positions of the higher modes are not produced as whole-number multiples of the fundamental mode, but instead also lie at non-whole number factors, for example, 1.6, 2.4, 3.15, etc. The higher frequencies are obtained without having to take into account the technological problems, which otherwise accompany further reduction of the frequency-determining layer thickness of the piezoelectric layer. Resonators of the type described herein also can be produced more reliably in terms of technology in contrast to known very-high frequency resonators.

Such a resonator has a layer structure comprising an acoustic reflector, a first electrode, a piezoelectric layer, and a second electrode over a substrate. The fundamental mode can be suppressed in such a resonator, for example, by varying the acoustic reflector. This comprises a sequence of reflector layers with different acoustic impedance values, which make available the necessary boundary surfaces for reflecting the acoustic wave. As a function of the layer thickness of the reflector layers, for structural overlapping of the reflected acoustic waves, a stop band is produced in which the reflector exhibits maximum reflection.

This stop band is adjusted so that the reflectivity of the acoustic reflector at the frequency of the fundamental mode is a minimum, but at the frequency of a higher harmonic mode it is a maximum. If one designates the fundamental mode as a first harmonic oscillation, then, higher modes can be excited, for example, the third, fifth, and seventh harmonic oscillation (all oscillation modes with mode number N>2). Because the excitation of a higher mode in a resonator with a mode number N≧5 has only a very weak effect, no other measures are necessary to suppress even higher modes. Therefore, when the fundamental mode is suppressed, the third harmonic mode is predominantly excited.

To effectively suppress the fundamental mode for a resonator, the reflector is modeled so that the stop band of the reflector is above the frequency of the fundamental mode. This is achieved by reducing the layer thicknesses of the individual reflector layers. Here, care is to be taken that the layer thickness of the reflector layers cannot be reduced to the extent that the stop band of the acoustic reflector is to be shifted in the direction of the resonance frequency of the higher mode. This is associated with the fact that the entire system of the resonator structure is disturbed by changes to the layer thicknesses, making other modifications necessary. These modifications can include, for example, also varying the thickness of the electrode layers. As a rule of thumb, it is still valid that an acoustic reflector has a maximum reflection at a given wavelength λ, if the thickness of each reflector layer equals approximately λ/4. With a reflector realized in this way, it is possible to obtain a maximum reflection in a window above the resonance frequency of the fundamental mode. The window is wide enough that a higher mode is reliably achieved and also excited by the reflector layers modified according to the invention.

In one embodiment, the acoustic reflector of the resonator is modified so that two resonances of approximately the same strength are excited or that the resonator can oscillate simultaneously in two modes. This can be achieved in that, for example, the thickness of an electrode layer of a conventional resonator oscillating essentially in the fundamental mode is increased by a factor n>2. This measure is sufficient to favor a second mode, so that it is excited equally in addition to the fundamental mode.

If the frequency of the higher mode is not a whole-number multiple of the frequency of the fundamental mode, then such a resonator oscillating at two resonance frequencies can be used for different applications. Through the non-whole number difference it is possible to clearly distinguish the two resonance frequencies of the resonator from possible upper harmonic waves and other technical artifacts of the fundamental mode. A resonator with two resonance frequencies can be used, for example, in a sensor arrangement in which an external parameter acts on the resonator, so that one of the two resonances is preferred or suppressed. Through the simple comparison of the resonance strength of the two resonances, a measurement value of the sensor is then determined, which can be assigned to the external parameter.

In another embodiment, the stimulation of oscillations of the resonator is simplified. An external connection of the resonator with series inductors achieves an increase in the distance between the pole and zero of the resonator. The effect acts on all of the excitable oscillation modes equally. The fundamental mode is suppressed so that the resonator connected to a series inductor shows improved oscillation in the higher mode. This can be recognized in a simple way on the phase profile, which, for a resonator connected to a series inductor, shows a considerable improvement, which corresponds approximately to a maximum phase shift of 180° at the resonance point. This is advantageous for resonators because the quality factor of the higher mode is perforce lower and the resonator therefore oscillates in the higher mode. With the series connection of an inductor, this is improved.

A similar effect can be achieved if a PZT material (lead-zirconate-titanate) is used as the material for the piezoelectric layer. This material-specific effect can also be amplified by a series connection of the resonator with a passive network and especially with a series inductor. Each of the two measures improves the oscillation of the higher mode and thus increases its quality factor.

A resonator can also be implemented as a stacked resonator or CRF arrangement (coupled-resonator-filter) or SCF (stacked crystal filter). Here, using a conventional resonator, another resonator is built with the intermediate placement of a coupled layer system. Therefore, above the second electrode of the first resonator, a coupled layer system and also a third electrode, a second piezoelectric layer, and a fourth electrode are provided.

The coupled layer system is used for setting an acoustic coupling between the first and the second resonators arranged one above the other in stacks. The coupled layer system can comprise a sequence of different layers, for example, a sequence made from layers of alternating higher and lower acoustic impedance. It is also possible, however, to construct a coupled layer system as a single layer of low impedance, for example, in the form of a relatively thin BCB layer (benzo-cyclobutene). One-layer "coupled layer systems" can also be implemented with other low-impedance materials, which can likewise be selected from organic materials.

Below, figures are used only for illustration and are therefore drawn only schematically and not true to scale. Neither absolute nor relative dimensions can be inferred from the Figures. Identical or equivalent parts are designated with the same reference symbols.

DETAILED DESCRIPTION

Figure 1A:
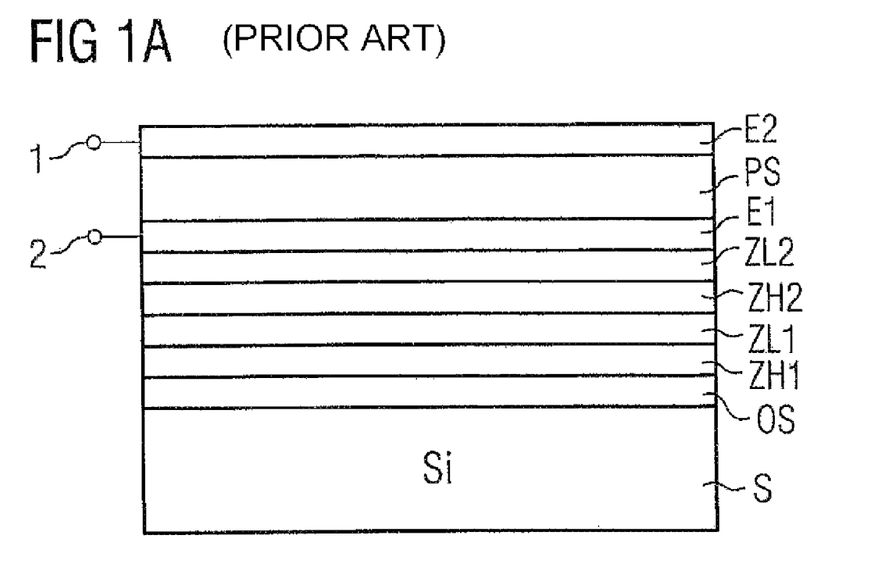
FIG. 1A shows a known resonator in schematic cross section.

With reference to a schematic cross section through the layer structure, FIG. 1 shows a known resonator of SMR type (reflector type, solidly mounted resonator) and also one possible wiring of the resonator in operation. Silicon is used, for example, as the substrate S here. The acoustic reflector here comprises four layers above an oxide layer OS, wherein here $SiO_2$ layers are used as low-impedance layers ZL and tungsten layers are used as high-impedance layers ZH. The first electrode E1 is made from aluminum, the piezoelectric layer PS is made, for example, from aluminum nitride, and the second electrode E2 is made from molybdenum.

Figure 1B:
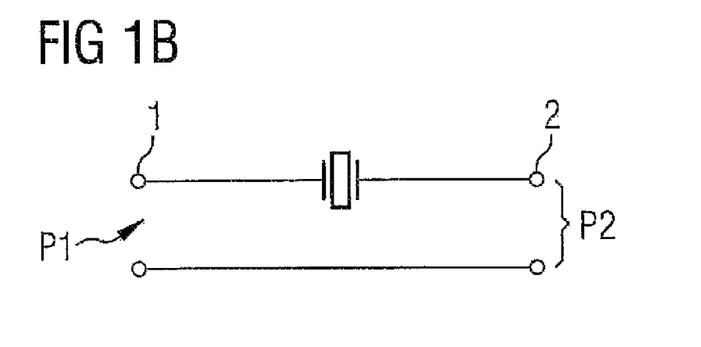
FIG. 1B shows one possible wiring, with which the resonator can be operated between a first and a second port P1, P2.

FIG. 1B shows one possible wiring, in which the resonator can be operated between a first and a second port P1, P2. Each second connection of each port P is connected to ground.

Figure 2A:
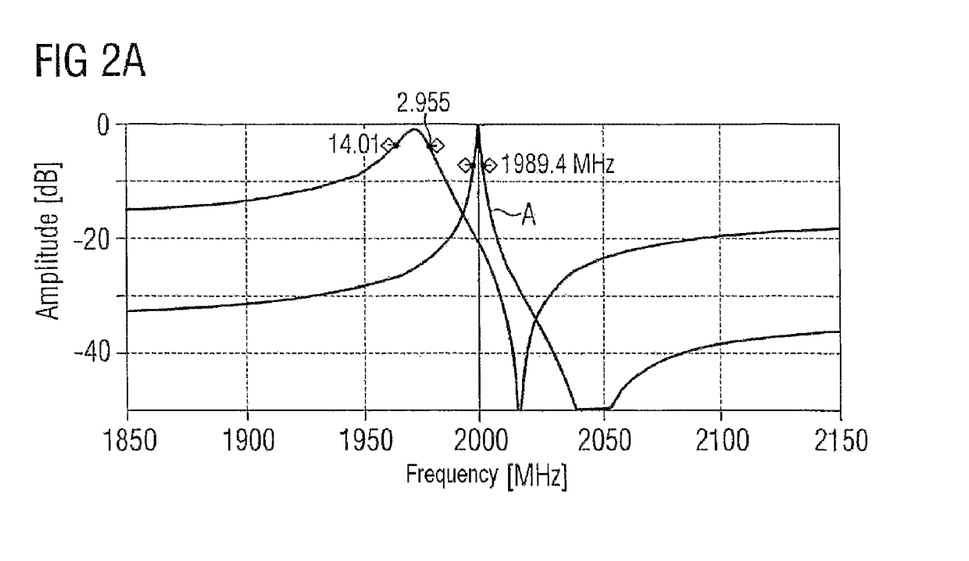
FIG. 2 shows the profile of the admittance of the known resonator.

FIG. 2 shows the fundamental mode of this resonator with reference to its admittance curve A, which was determined in a wiring as in FIG. 1B, wherein the resonator oscillates versus air. The profile of the admittance A versus the frequency allows the resonance frequency at the zero of the curve to be identified at ca. 2000 MHz. At ca. 2045 MHz there is a pole, which corresponds to the anti-resonance frequency and thus to the location of maximum admittance. The two shown curves are defined for resonators with different surface areas, wherein one time the resonance and one time the anti-resonance are expressed more sharply.

Figure 2B:
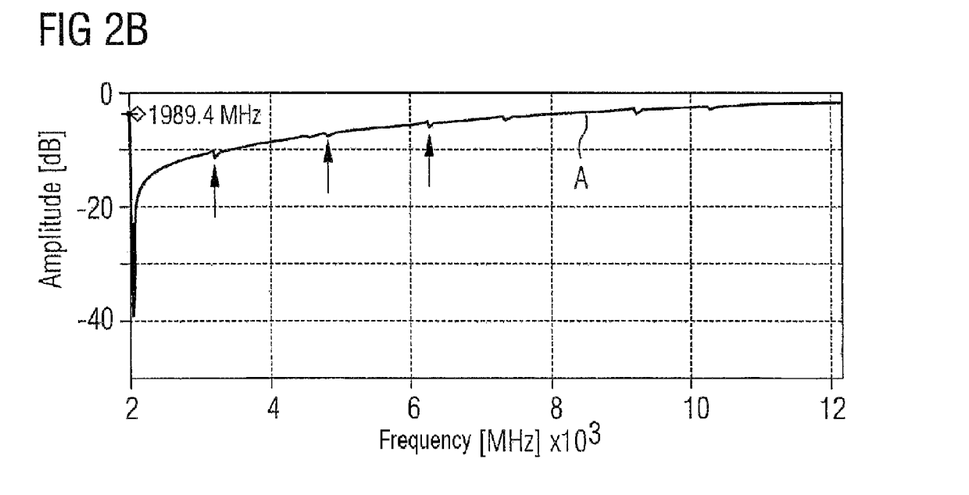

FIG. 2B shows the same representation in larger scale. In addition to the strong resonance at 2 GHz, in the admittance curve A, minimally expressed, but still visible higher modes can be identified, which are referred to in the Figure with arrows and which here are at ca. 3.2 GHz, 4.8 GHz, and 6.3 GHz. The resonator mode at 3 GHz can be identified as a reflection mode, which occurs due to a resonance effect of the reflector. It is shown that the higher modes are significantly suppressed and are at a ratio relative to the frequency of the fundamental mode of 1.00, 1.60, 2.40, or 3.15, etc. Therefore, such a resonator is suitable and optimized exclusively for operation in the fundamental mode. The acoustic reflector of the resonator is set so that it exhibits maximum reflection at the resonance frequency of the fundamental mode.

Figure 3:
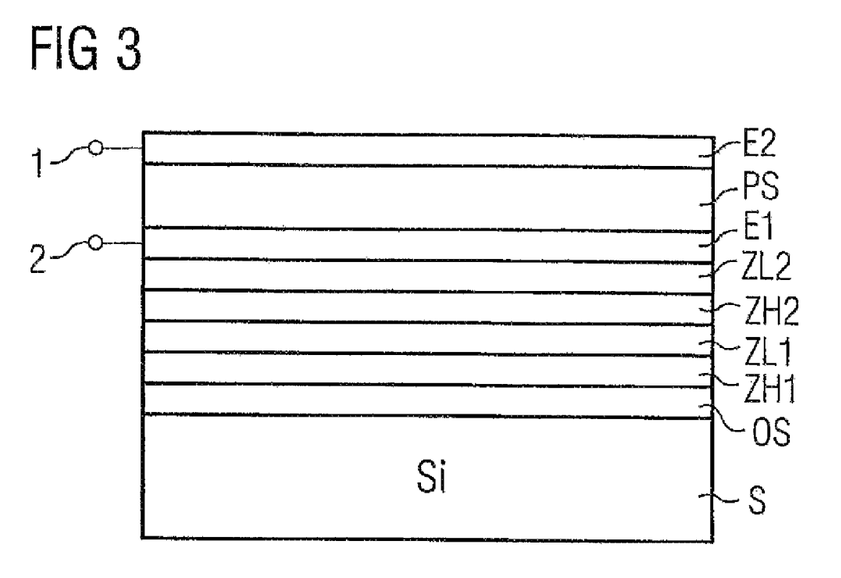
FIG. 3 shows the layer structure of a first resonator.

FIG. 3 shows the layer structure of a first embodiment with reference to a schematic cross section. The resonator features the same number of layers, which are varied merely relative to the layer thickness. In addition, for better modification, the second electrode E2 is constructed from aluminum and reduced in layer thickness. If one selected, for this system, the acoustic reflector from the first embodiment according to FIG. 1, then the resonator would oscillate in its fundamental mode at a frequency of ca. 2 GHz. In the resonator of FIG. 3, all of the reflector layers are divided relative to their thickness by the factor 4. Thus, a higher oscillation mode at ca. 6.1 GHz is achieved, while simultaneously the fundamental mode at ca. 2 GHz is suppressed to a good degree. The embodiment is arranged on a substrate S made from silicon and a first oxide layer OS. Above these layers, alternating high-impedance layers ZH and low-impedance layers ZL are arranged again.

Figure 4A:
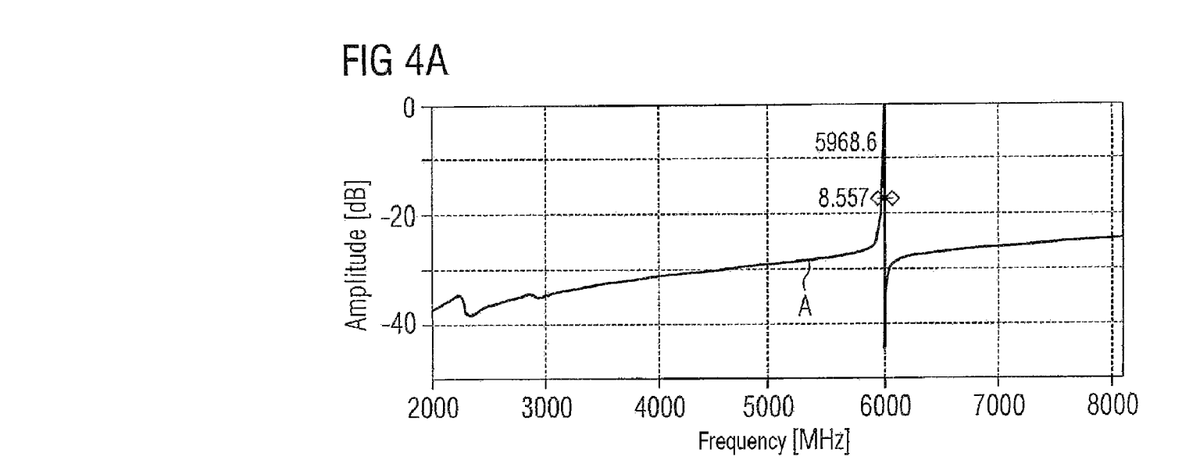
FIG. 4 shows the profile of the admittance of the resonator.
Figure 4B:
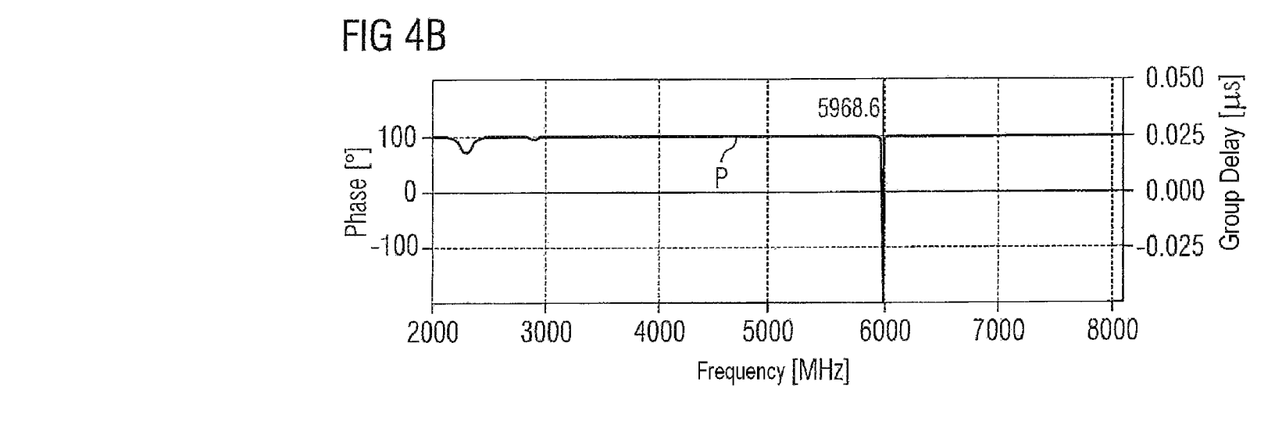

FIG. 4 shows the profile of impedance A (FIG. 4A) and phase P (FIG. 4B) of the resonator of FIG. 3. It can be seen that the resonator exhibits a pronounced oscillation only at ca. 6.1 GHz, whose phase response according to FIG. 4B shows a good phase variation of not quite 180°. Because only a small phase variation is observed at the resonance frequency of the fundamental mode, the Figures makes it clear that the resonator oscillates primarily in its higher mode, here the third harmonic mode. Thus, it is shown that targeted higher modes are already excited with a non-optimized embodiment and the fundamental mode can be almost completely suppressed.

Figure 5:
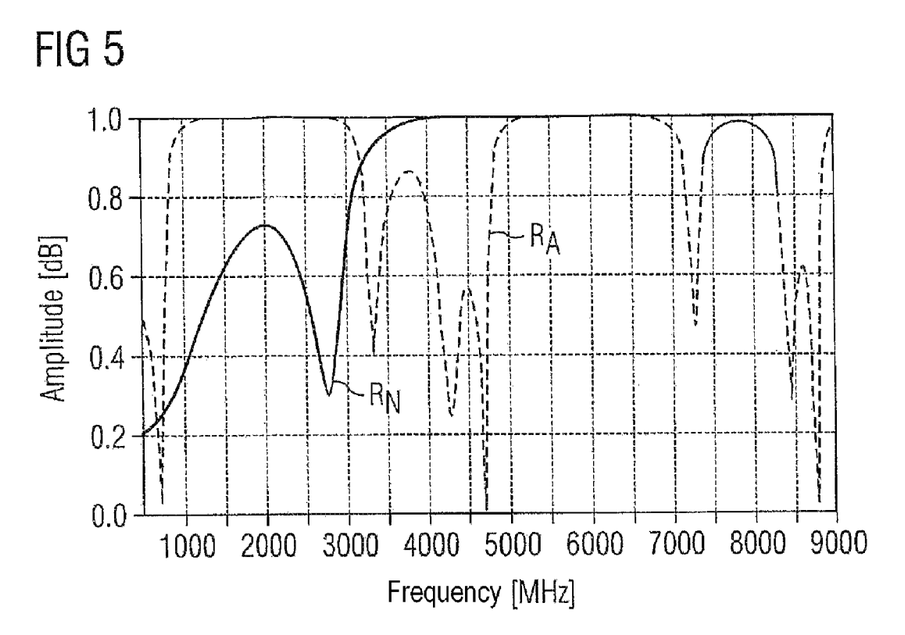
FIG. 5 shows the reflection spectrum of an acoustic reflector.

The variation of the reflector is useful for the functioning of the resonator. FIG. 5 shows the reflection response $R_N$ of the reflector shown in the embodiment according to FIG. 3, in which all of the reflector layers are reduced by the factor 4.1 relative to an acoustic reflector tuned to the fundamental mode. The relative reflectivity of the reflector versus frequency is plotted. In contrast, for comparison, the reflection response $R_A$ of the corresponding known acoustic reflector tuned to the fundamental mode is shown, which otherwise has the same structure.

An optimal reflector should have a zero at which the fundamental mode is damped to a maximum degree, for the frequency of the fundamental mode at approximately 2 GHz, so that the reflector is transparent at this point for the wave. The reflector shown in FIG. 5 by a reflection response $R_N$ and not yet optimized due to still present reflector distortion exhibits a definitely damped but not completely eliminated reflectivity for the frequency of the fundamental mode at approximately 2 GHz. For higher frequencies, however, this non-optimized reflector already functions as a nearly ideal reflective element. Therefore, in principle, all higher modes are ready for propagation. For the range around 6 GHz, the reflector has a maximum value of reflection of 1.0, so that here a maximum excitation of the third harmonic mode residing there is guaranteed. In connection with FIG. 4, it is also clear that the reflector spectrum would allow the excitation of higher modes, but this does not occur, so that for suppressing even higher modes, no additional measures must be taken for a resonator structure according to the invention.

In general, it is to be determined that the exact position of the reflection centers, that is, the locations at which a reflector optimally reflects, is also still a function of the thickness of the electrodes E. This leads to the fact that starting from a known reflector reflecting at a given fundamental mode, a reflector optimally reflecting at a higher mode can usually not be obtained exclusively through a reduction of the reflector layers in the ratio of the respective frequencies to each other. Instead, other factors are to be considered that cannot be easily represented. However, in principle it is possible at any time to arrange the stop band of the reflector above the fundamental mode. For the most part, a reflection response is obtained that fulfills the desired purpose, namely the suppression of the fundamental mode and the maximum reflection of the higher mode.

Figure 6:
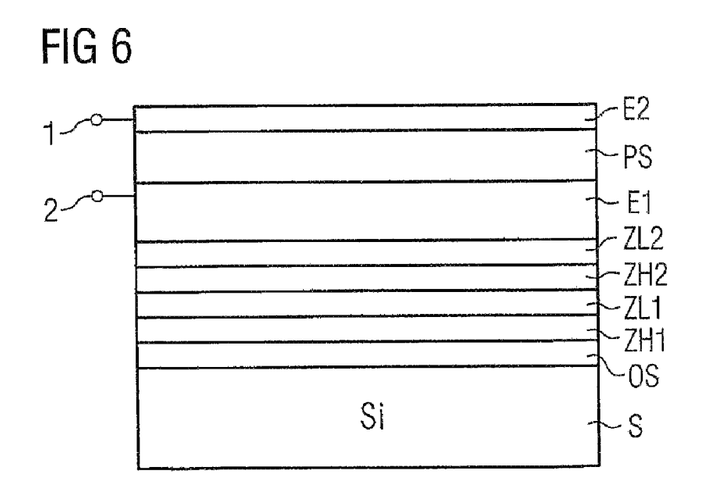
FIG. 6 shows another resonator in schematic cross section.

FIG. 6 shows, with reference to a schematic cross section, another embodiment. Shown is a layer structure for a resonator that exhibits an approximately equally strong resonance at two different frequencies, that is, in two different modes. It again starts with a resonator that is optimized to a fundamental mode lying at ca. 2 GHz, similar to the resonator illustrated in FIG. 1. By varying, in particular, the layer thickness of the first electrode E1, the structure shown here is obtained. In comparison with FIG. 1, here the top electrode E2 is constructed from aluminum and the layer thickness of the piezoelectric layer is modified somewhat. The layer thickness values are, in detail: OS=533 nm, ZH1=638 nm, ZL1=641 nm, ZH2=639 nm, ZL2=655 nm, E1=1000 nm, PS=1885 nm, and E2=150 nm.

Figure 7A:
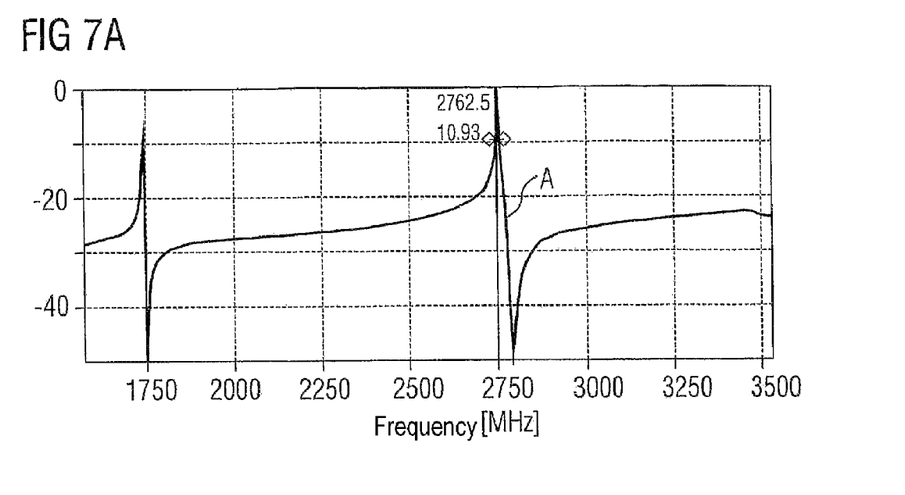
FIG. 7 shows the profile of the admittance for this resonator.
Figure 7B:
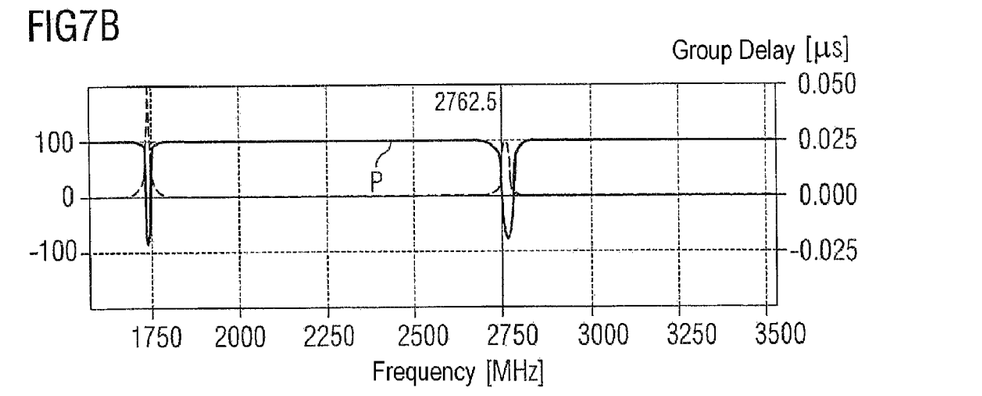

FIG. 7 shows the resonance response of this resonator with reference to the impedance curve A (FIG. 7A) and the phase profile P (FIG. 7B). It is easy to see that, in addition to a first mode at ca. 1700 MHz, the second harmonic also experiences significant excitation at approximately 2750 MHz. Thus, a resonator is provided that oscillates in two modes with approximately equal strength.

Figure 8:
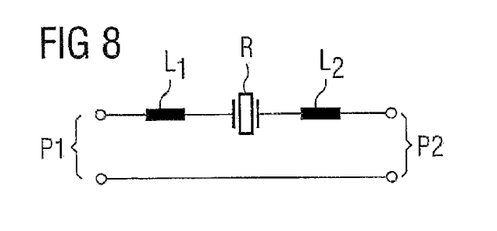
FIG. 8 shows one possible wiring of a resonator.

FIG. 8 shows one possibility for wiring a resonator R with external switching elements. Shown is the series wiring of the resonator with two series inductors L1, L2. Here, the resonator is connected to ground as a two-port resonator. With the aid of these external switching elements L1, L2, the pole/zero spacing can be increased.

Figure 9A:
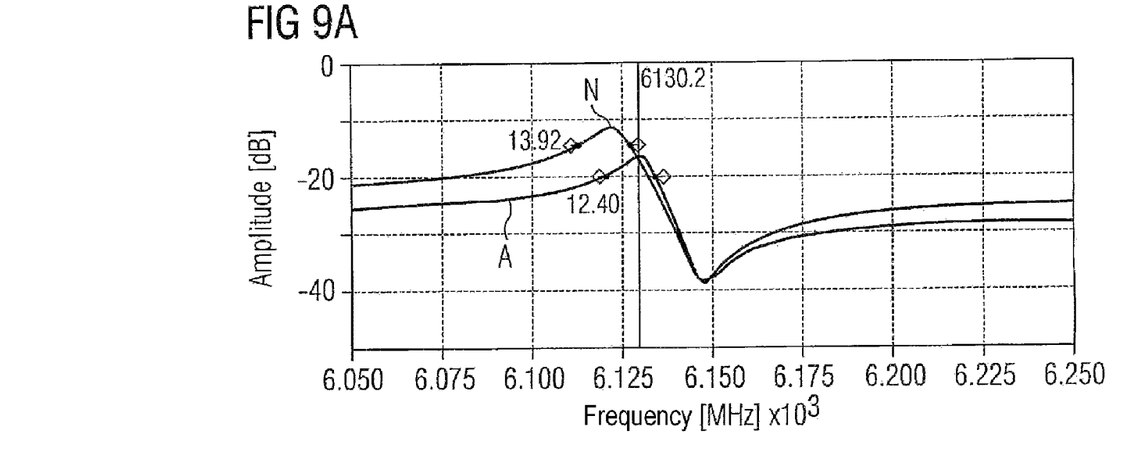
FIG. 9 shows the effect of a series inductor on the profile of the phase.
Figure 9B:
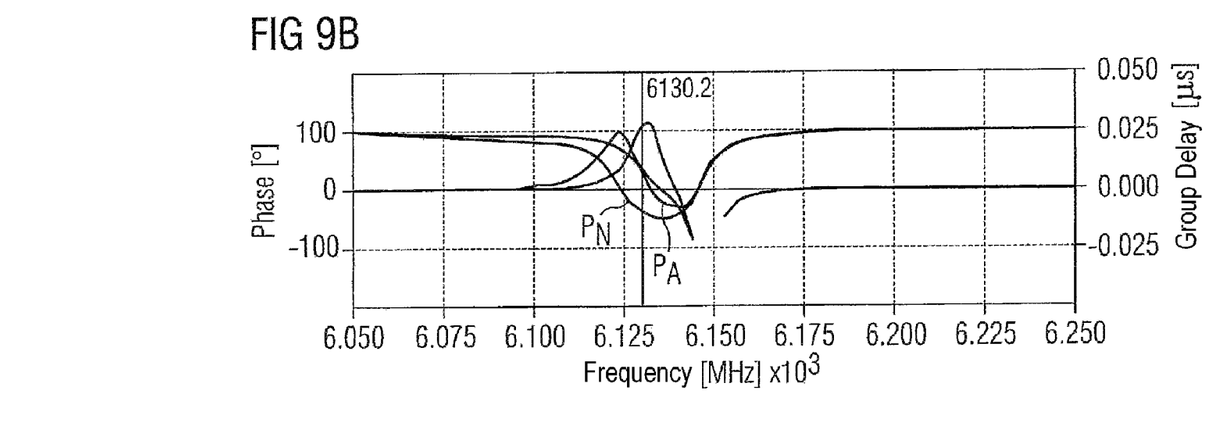

FIGS. 9A and 9B show this with reference to the corresponding admittance curves or with reference to the phase response of a correspondingly wired resonator, wherein the layer structure described in FIG. 3 is used as a resonator. FIG. 9A shows the transmission curve N of the embodiment according to FIG. 8, while it is compared to the already described behavior of a resonator according to FIG. 3 without external wiring elements with the curve labeled A. While the pole remains nearly unchanged, the zero changes towards deeper frequencies. This creates an increase in the pole/zero spacing. This greater spacing, which corresponds to a higher bandwidth but simultaneously also to a reduction in quality, allows a better stimulation of the oscillations of the resonator. This is shown with reference to FIG. 9B, in which the phase response of the resonator is shown. The change in phase of the externally wired resonator is considerably more pronounced than that of a non-externally wired resonator, such as, e.g., that of a resonator according to the embodiment of FIG. 3.

Figure 10A:
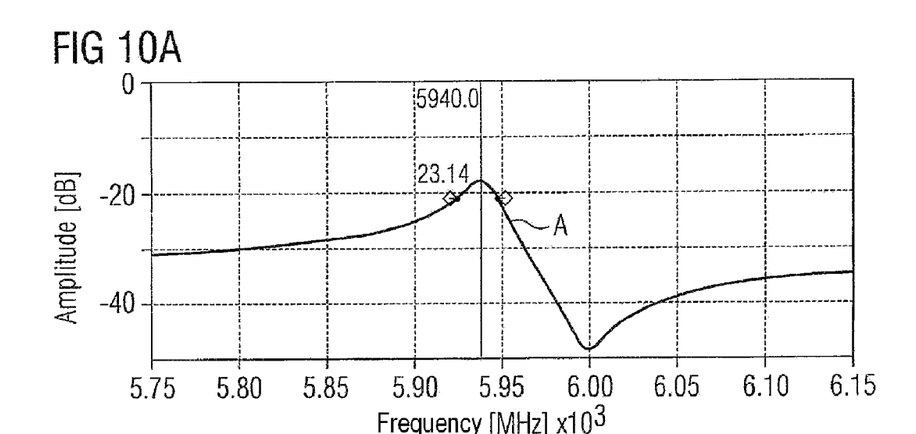
FIG. 10 shows the profile of the admittance and the phase for a third embodiment.
Figure 10B:
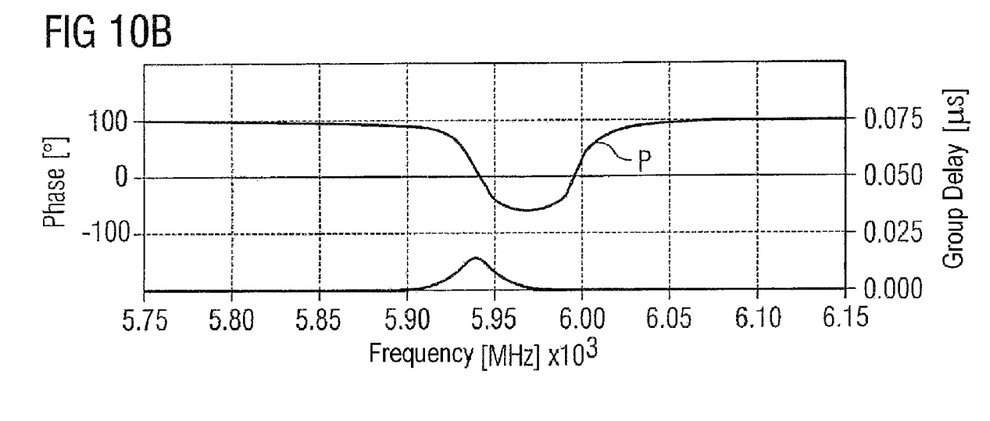

FIGS. 10A/10B show the transmission response A and the phase response P of another resonator, in which the piezoelectric layer is produced from PZT. This material has significantly greater pole/zero spacing than the aluminum nitride used in the previous embodiments, so that here the higher modes also have a higher pole/zero spacing. This example also shows that, with the aid of PZT, a well pronounced phase change of the higher mode can be achieved, which can be seen especially in the phase response according to FIG. 10B.

Figure 11:
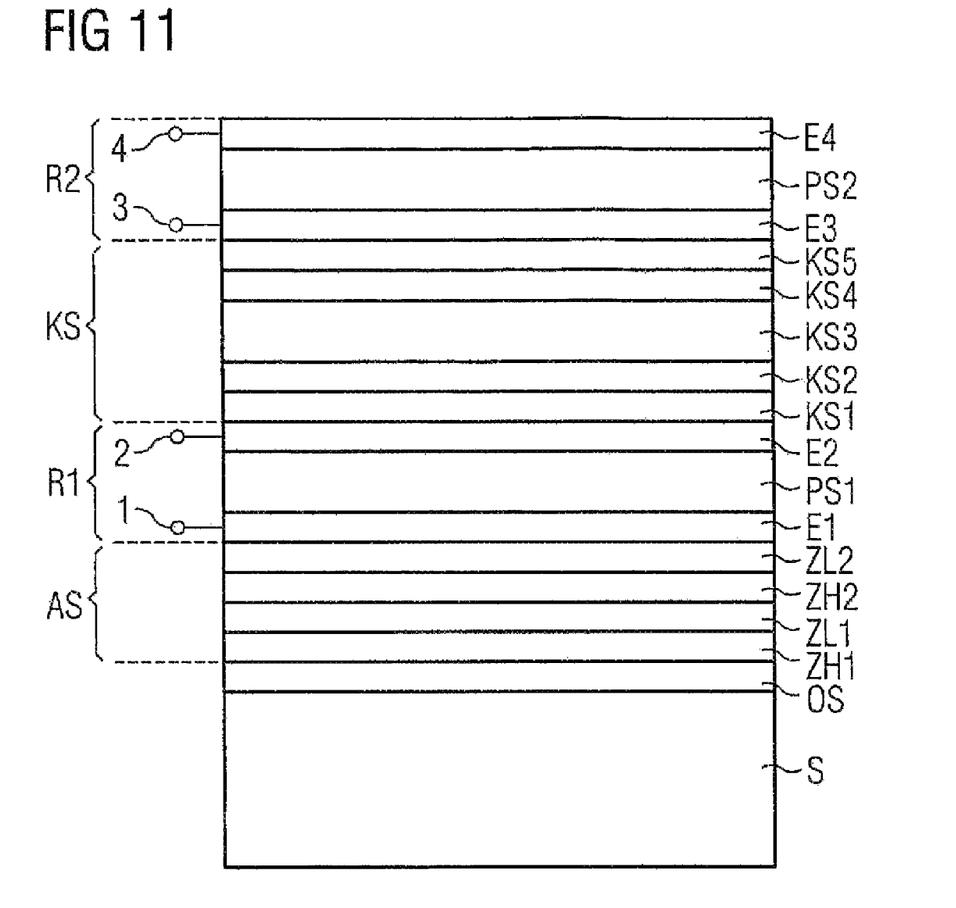
FIG. 11 shows the layer structure of a CRF filter.

FIG. 11 shows another embodiment for the layer structure of a resonator, which is constructed as a CRF filter (coupled resonator filter) and which comprises two resonators R1, R2 formed one above the other. While the bottom resonator R1 is constructed as before above an acoustic reflector AS from reflector layers ZH, ZL with alternating relatively high and relatively low acoustic impedance, above these layers, as the coupled layer system KS, an alternating layer sequence made from $SiO_2$ layers KS1, KS3, KS5, and aluminum nitride layers KS2, KS4 is provided. Finally or next, on top of this system, the second resonator with the third electrode E3, the second piezoelectric layer PS2, and the fourth electrode E4 are arranged. While the acoustic reflector can be constructed according to the embodiment shown in FIGS. 3 and 6, in this embodiment the remaining layers have the following layer thickness values: E1 (Al, 174 nm); PS1 (AlN, 2541 nm); E2 (Al, 174 nm), KS1 ($SiO_2$, 800 nm), KS2 (AlN, 1531 nm), KS3 (SIO2, 408 nm); KS4 (AlN, 1531 nm), KS5 ($SiO_2$, 800 nm), E3 (Al, 174 nm), PS2 (AlN, 2541 nm), E4 (Al, 174 nm).

While previously individual resonators were considered, here a complete filter is implemented by the two resonators arranged one above the other with the coupled layer system KS arranged therebetween. Port 1 is formed by the two connections 1 and 2. In contrast, port 2 is formed by the two connections 3 and 4, which each contact the electrodes. This filter has a passband, which corresponds to the resonance frequency of the higher mode. For the actual fundamental mode of the filter, which is suppressed by the corresponding modification of the acoustic reflector, high damping is achieved. Another variation of this resonator filter provides that the coupled layer system KS is replaced by an individual coupling layer, for example, by a BCB layer of 175 nm. For otherwise constant layer thicknesses and layer materials, with this configuration a filter response is also achieved that has a passband in the region of the higher mode.

Only a few embodiments are described herein. The scope of this disclosure covers varying and optimizing layer thicknesses, in order to achieve an optimum suppression of the fundamental mode. Corresponding layer thickness modifications may also be used when materials of the reflector, electrode, and piezoelectric layer are changed. Because each change disrupts the entire system for a system that has been optimized once, after modifying a single layer, usually other modifications are necessary to a smaller extent for

The invention claimed is:

1. A bulk acoustic wave (BAW) resonator comprising:
   a substrate; and
   a layer structure above the substrate, the layer structure comprising:
      an acoustic reflector;
      a first electrode;
      a piezoelectric layer; and
      a second electrode, the first and second electrodes being adjacent to the piezoelectric layer;
   wherein the BAW resonator is configured to suppress a fundamental mode of a bulk acoustic wave in the BAW resonator, the fundamental mode having a wavelength that is twice a distance between the first electrode and the second electrode.

2. The BAW resonator of claim 1, wherein the acoustic reflector comprises reflector layers having layer thicknesses that achieve a minimum reflectivity at a frequency of the fundamental mode and that achieve a maximum reflectivity at a frequency of a mode that is higher than the fundamental mode.

3. The BAW resonator of claim 2, wherein a thickness of at least one reflector layer that supports oscillation of the resonator in the fundamental mode is less than a thickness of an ideal reflector.

4. The BAW resonator of claim 2, wherein a thickness of at least one electrode layer is higher than a thickness of an electrode layer in a resonator oscillating exclusively in the fundamental mode.

5. The BAW resonator of claim 1, which is wired to a passive network that increases a distance between a pole and a zero of the BAW resonator.

6. The BAW resonator of claim 1, wherein the piezoelectric layer comprises a PZT material.

7. The BAW resonator of claim 1, which is configured to oscillate significantly at more than one frequency.

8. The BAW resonator of claim 1, further comprising:
   a coupling layer above the second electrode; and
   another resonator above the coupling layer, the other resonator comprising:
      a third electrode;
      a second piezoelectric layer; and
      a fourth electrode.

9. The BAW resonator of claim 8, wherein the coupling layer comprises layers comprised of reflector layers with alternating high and low acoustic impedance.

10. The BAW resonator of claim 8, wherein the coupling layer comprises a uniform layer having a low acoustic impedance.

11. The BAW resonator of claim 1, wherein a stop band of the acoustic reflector at which the acoustic reflector reflects at a maximum is at a frequency above the fundamental mode.

12. The BAW resonator of claim 1, which is connected to other BAW resonators to form a filter.

13. The BAW resonator of claim 1, which is connected to other BAW resonators to form a duplexer.

14. The BAW resonator of claim 1, further comprising:
   a coupling layer above the second electrode; and
   another resonator above the coupling layer.

15. The BAW resonator of claim 14, wherein the coupling layer comprises layers comprised of reflector layers with alternating high and low acoustic impedance.

16. The BAW resonator of claim 14, wherein the coupling layer comprises one layer having a single acoustic impedance.

17. The BAW resonator of claim 8, wherein the piezoelectric layer comprises a PZT material.

18. The BAW resonator of claim 8, wherein the coupling layer comprises one layer having a single acoustic impedance.

19. A bulk acoustic wave (BAW) resonator comprising:
   a substrate; and
   a layer structure above the substrate, the layer structure comprising:
      an acoustic reflector;
      a first electrode;
      a piezoelectric layer; and
      a second electrode;
   wherein the BAW resonator is configured to suppress a fundamental mode of a bulk acoustic wave in the BAW resonator;

wherein the acoustic reflector comprises reflector layers having layer thicknesses that achieve a minimum reflectivity at a frequency of the fundamental mode and that achieve a maximum reflectivity at a frequency of a mode that is higher than the fundamental mode; and wherein a thickness of at least one reflector layer that supports oscillation of the resonator in the fundamental mode is less than a thickness of an ideal reflector.

20. A bulk acoustic wave (BAW) resonator comprising:
a substrate; and
a layer structure above the substrate, the layer structure comprising:
  an acoustic reflector;
  a first electrode;
  a piezoelectric layer; and
  a second electrode;
wherein the BAW resonator is configured to suppress a fundamental mode of a bulk acoustic wave in the BAW resonator;
wherein the acoustic reflector comprises reflector layers having layer thicknesses that achieve a minimum reflectivity at a frequency of the fundamental mode and that achieve a maximum reflectivity at a frequency of a mode that is higher than the fundamental mode; and
wherein a thickness of at least one electrode layer is higher than a thickness of an electrode layer in a resonator oscillating exclusively in the fundamental mode.

* * * * *

UNITED STATES PATENT AND TRADEMARK OFFICE
CERTIFICATE OF CORRECTION

PATENT NO. : 7,719,388 B2  
APPLICATION NO. : 11/658117  
DATED : May 18, 2010  
INVENTOR(S) : Edgar Schmidhammer Page 1 of 1

It is certified that error appears in the above-identified patent and that said Letters Patent is hereby corrected as shown below:

Title Page, Title; item (54);

Delete [BULK ACOUSTIC] and Insert --ACOUSTIC BULK--

Column 1, Title; lines 1-2;

Delete [BULK ACOUSTIC] and Insert --ACOUSTIC BULK--

Signed and Sealed this
Fifteenth Day of February, 2011

David J. Kappos
*Director of the United States Patent and Trademark Office*